United States Patent
Kanai et al.

(10) Patent No.: US 11,862,998 B2
(45) Date of Patent: Jan. 2, 2024

(54) BATTERY MANAGEMENT DEVICE AND INTEGRATED CIRCUIT

(71) Applicant: HITACHI AUTOMOTIVE SYSTEMS, LTD., Hitachinaka (JP)

(72) Inventors: Tomonori Kanai, Hitachinaka (JP); Hikaru Miura, Hitachinaka (JP); Tomoyuki Arima, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 211 days.

(21) Appl. No.: 17/253,369

(22) PCT Filed: May 20, 2019

(86) PCT No.: PCT/JP2019/019850
§ 371 (c)(1),
(2) Date: Dec. 17, 2020

(87) PCT Pub. No.: WO2020/003806
PCT Pub. Date: Jan. 2, 2020

(65) Prior Publication Data
US 2021/0265845 A1    Aug. 26, 2021

(30) Foreign Application Priority Data
Jun. 27, 2018 (JP) .................. 2018-121808

(51) Int. Cl.
*H02J 7/00*    (2006.01)
*H01M 10/48*   (2006.01)

(52) U.S. Cl.
CPC ........... *H02J 7/0016* (2013.01); *H01M 10/48* (2013.01); *H02J 7/0071* (2020.01)

(58) Field of Classification Search
CPC ...... H02J 7/0071; H02J 7/007; H02J 7/00047; B60L 58/22; H01M 10/44
See application file for complete search history.

(56) References Cited

U.S. PATENT DOCUMENTS

| 2011/0199051 A1* | 8/2011 | Shimizu | H02J 7/0016 320/116 |
| 2013/0200850 A1* | 8/2013 | Ke | H02J 7/0016 320/118 |

(Continued)

FOREIGN PATENT DOCUMENTS

| JP | 2011-166979 A | 8/2011 |
| JP | 2014-058290 A | 4/2014 |

(Continued)

OTHER PUBLICATIONS

International Search Report with English translation and Written Opinion issued in corresponding application No. PCT/JP2019/019850 dated Aug. 27, 2019.

*Primary Examiner* — Richard Isla
*Assistant Examiner* — Sadia Kousar
(74) *Attorney, Agent, or Firm* — Foley & Lardner LLP

(57) ABSTRACT

To improve reliability in balancing while suppressing power consumption during balancing. A battery management device 1 includes cell cons 41 and 42 that perform balancing for adjusting voltages of a plurality of battery cells 2 that are secondary batteries, and a control unit 3 that controls the cell cons 41 and 42. The cell con 41 includes the main timer 412 that measures the elapsed time for stopping the cell con 41, and the stop management unit 413 that stops the cell con 41 when the main timer 412 is abnormal. In the battery management device 1, the battery cell 2 that supplies power to the main timer 412 and the stop management unit 413, and the lead storage battery 7 that supplies power to the control unit 3 are power supplies different from each other.

13 Claims, 6 Drawing Sheets

(56) References Cited

U.S. PATENT DOCUMENTS

| | | | | |
|---|---|---|---|---|
| 2014/0159671 A1* | 6/2014 | Kawahara | ............... | B60L 58/14 |
| | | | | 320/134 |
| 2015/0303728 A1* | 10/2015 | Miura | ................. | H01M 10/425 |
| | | | | 320/119 |
| 2015/0340883 A1* | 11/2015 | Kanai | ................. | H01M 10/482 |
| | | | | 320/118 |
| 2019/0243310 A1* | 8/2019 | Nagareda | .................. | G04F 3/06 |

FOREIGN PATENT DOCUMENTS

| | | |
|---|---|---|
| JP | 2017-220966 A | 12/2017 |
| WO | WO-2014/061153 A1 | 4/2014 |
| WO | WO-2014/115310 A1 | 7/2014 |

\* cited by examiner

BATTERY MANAGEMENT DEVICE AND INTEGRATED CIRCUIT

TECHNICAL FIELD

The present invention relates to a battery management device and an integrated circuit.

BACKGROUND ART

In order to secure a desired high voltage, hybrid electric vehicles (HEV) and electric vehicles (EV) generally use an assembled battery (battery system) configured by connecting a large number of secondary battery cells in series. Conventionally, a battery management device is connected to such an assembled battery via a wire harness for capacity calculation or protection management of each battery cell. Such a battery management device manages each battery cell by controlling a charge/discharge state of each battery cell.

In the above-mentioned battery management device, in order to reduce a voltage variation of each battery cell, it is known that each battery cell is individually discharged to perform balancing for equalizing the voltage of each battery cell. Regarding improvement of reliability in balancing, the technique of PTL 1 below has been proposed. In PTL 1, there is disclosed a battery monitoring device including a voltage equalization circuit that equalizes a voltage of each battery cell of an assembled battery configured by connecting a plurality of battery cells in series, and a control means that outputs an instruction signal for instructing the voltage equalization circuit to start an equalization operation of each battery cell, and each of the voltage equalization circuit and the control means is provided with a timer unit that stops the equalization operation when an elapsed time from a start of the equalization operation of each battery cell reaches a predetermined set time.

CITATION LIST

Patent Literature

PTL 1: JP 2011-166979 A

SUMMARY OF INVENTION

Technical Problem

In the technique described in PTL 1, each of the voltage equalization circuit and the control means is provided with a timer for monitoring an elapsed time from the start of balancing. These two timers operate by consuming power supplied from different power sources during balancing. Therefore, there is a problem that power consumption of the entire device during balancing is large.

Solution to Problem

A battery management device according to the present invention includes a cell controller that performs balancing for adjusting voltages of a plurality of secondary batteries, and a control unit that controls the cell controller, in which the cell controller includes a main timer that measuring an elapsed time for stopping the cell controller, and a stop management unit that stops the cell controller when the main timer is abnormal, and a first power supply that supplies power to the main timer and the stop management unit and a second power supply that supplies power to the control unit are power supplies different from each other.

An integrated circuit according to the present invention is mounted on a cell controller that is connected to a plurality of secondary batteries and performs balancing for adjusting voltages of the plurality of secondary batteries, and includes a main timer that measures an elapsed time for stopping the cell controller, and a stop management unit that stops the cell controller when the main timer is abnormal, and the main timer and the stop management unit operate by receiving power supply from a power supply different from a control unit that controls the cell controller.

Advantageous Effects of Invention

According to the present invention, it is possible to improve reliability in balancing while suppressing power consumption during balancing.

DESCRIPTION OF EMBODIMENTS

First Embodiment

Figure 1:
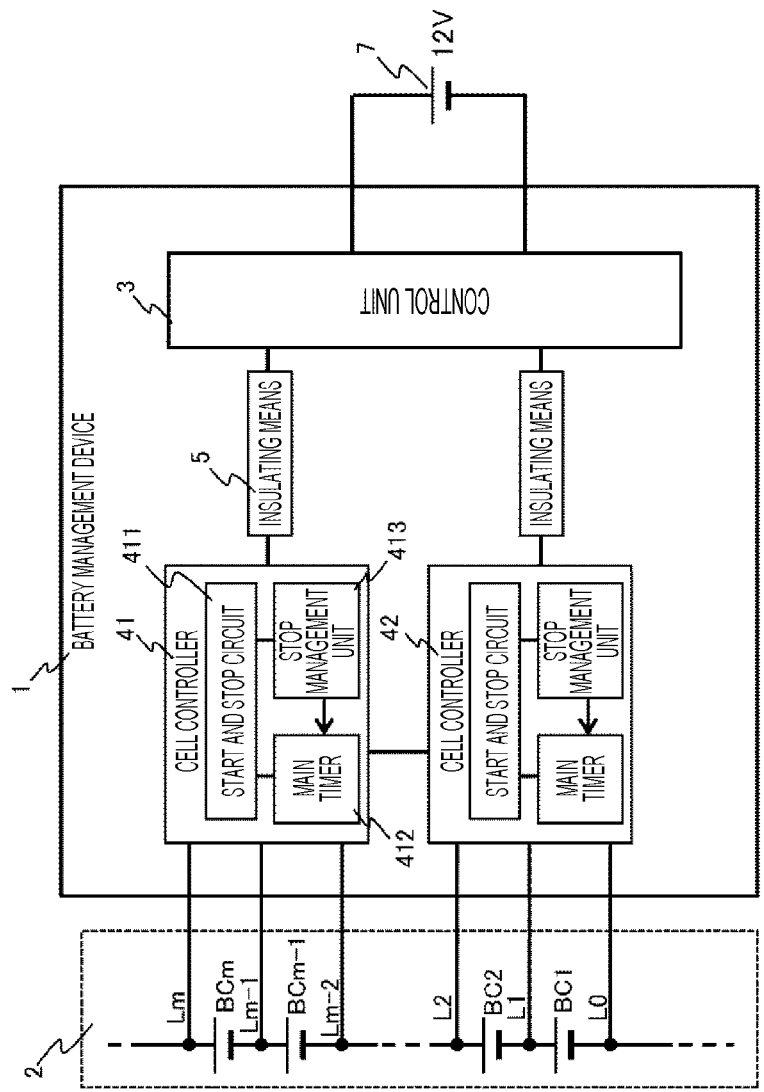
FIG. 1 is a diagram illustrating a configuration of a battery management device according to a first embodiment of the present invention.

FIG. 1 is a diagram illustrating a configuration of a battery management device according to a first embodiment of the present invention. The battery management device 1 illustrated in FIG. 1 manages m battery cells 2 connected in series, and is connected to the battery cells 2 and a lead storage battery 7. Each battery cell 2 is configured by using a chargeable/dischargeable secondary battery, for example, a lithium ion battery. In FIG. 1, the m battery cells 2 are represented by BC1 to BCm, respectively, and lines connecting between the battery management device 1 and positive and negative electrodes of each battery cell 2 are represented by D0 to Lm.

The battery management device 1 includes a control unit 3, cell controllers (hereinafter, abbreviated as "cell cons") 41 and 42, and an insulating means 5. The cell cons 41 and 42 are respectively connected to a plurality of battery cells 2, and have a function of measuring a voltage of each battery cell 2 and a function of controlling a discharge of each battery cell 2 and performing balancing to adjust the voltage of each battery cell 2. Note that in FIG. 1, the cell con 42 is connected to the battery cells 2 of BC1 and BC2, the cell con 41 is connected to the battery cells 2 of BCm−1 and BCm, and a cell con connected to other battery cells 2 is not illustrated. However, in reality, the number of cell cons provided in the battery management device 1 or the number of battery cells 2 connected to each cell con is not limited to the example of FIG. 1 and can be set arbitrarily.

The control unit 3 has a function of acquiring cell voltage information regarding the voltage of each battery cell 2 measured by the cell cons 41 and 42 from the cell cons 41 and 42, and controlling the cell cons 41 and 42 based on the acquired cell voltage information. Specifically, for example, the control unit 3 determines whether or not a voltage variation of each battery cell 2 is a predetermined value or more based on the cell voltage information. As a result, when it is determined that the voltage variation is the predetermined value or more, the control unit 3 sets a discharge time according to a voltage difference between the battery cell 2 having a relatively high voltage and other battery cells 2, and instructs the cell cons 41 and 42 to discharge the battery cell 2 for the discharge time. According to the discharge instruction from the control unit 3, the cell cons 41 and 42 perform balancing by performing discharge control of each battery cell 2 so that a specified battery cell 2 is discharged for a specified discharge time to reduce the voltage variation of each battery cell 2.

Further, the control unit 3 sets a balancing time instructing an execution time of balancing in the cell cons 41 and 42, and transmits information on the set balancing time to the cell cons 41 and 42 together with the discharge instruction. When the balancing time instructed by the control unit 3 elapses, the cell cons 41 and 42 end balancing and automatically stop.

The control unit 3 is connected to the lead storage battery 7 and operates by receiving power supply from the lead storage battery 7. On the other hand, the cell cons 41 and 42 are not connected to the lead storage battery 7 and operate by receiving power supply from the battery cell 2.

The insulating means 5 is a means for insulating communication signals between the control unit 3 and the cell cons 41 and 42. As the insulating means 5, a well-known insulating method such as, for example, a photo coupler, a photo MOS relay, a pulse transformer, a digital isolator, a capacitor, and radio communication can be applied. The battery management device 1 can separate the lead storage battery 7 which is a power source of the control unit 3 and the battery cell 2 which is a power source of the cell cons 41 and 42 by having the insulating means 5 between the control unit 3 and the cell cons 41 and 42.

The cell cons 41 and 42 each include a start and stop circuit 411, a main timer 412, and a stop management unit 413. Power for operating these is supplied from the battery cell 2 that supplies power to the cell cons 41 and 42, and is power different from the lead storage battery 7 that supplies power to the control unit 3. Note that since the cell cons 41 and 42 have the same function and configuration, the function and configuration of the cell con 41 will be described below, and the description of the cell con 42 will be omitted.

The start and stop circuit 411 is a circuit that controls the start and stop of the cell con 41. The main timer 412 measures an elapsed time after the cell con 41 starts balancing, and instructs the start and stop circuit 411 to stop the cell con 41 when a measurement result of the elapsed time reaches the balancing time instructed by the control unit 3. That is, when the balancing is started in the cell con 41, the main timer 412 measures the elapsed time for stopping the cell con 41 accordingly. The stop management unit 413 stops the cell con 41 and ends the balancing even when the main timer 412 cannot operate normally by instructing the start and stop circuit 411 to stop the cell con 41 when the main timer 412 is abnormal. The details of the stop management unit 413 will be described later.

In the following, the operations of the control unit 3 and the cell con 41 when performing balancing when the battery management device 1 and the battery cell 2 are mounted on a vehicle such as a hybrid electric vehicle (HEV) or an electric vehicle (EV), and the vehicle is stopped will be described. Note that since the operation of the cell con 42 is the same as that of the cell con 41, the description thereof will be omitted.

When performing balancing, the control unit 3 transmits information for setting a balancing time to the main timer 412 to the cell con 41 together with a balancing instruction while the vehicle is stopped (key off), and then stops. By stopping the control unit 3 after setting the balancing time, the power consumption of the lead storage battery 7 during balancing is suppressed. However, at this time, the control unit 3 may not be completely stopped, and may continue to operate in a standby state so that it can be started immediately upon receiving a signal from the cell cons 41 and 42 or a host controller (not illustrated). That is, the control unit 3 has a normal operation mode in which power is supplied from the lead storage battery 7 and performs an operation such as setting of the balancing time, and a low power consumption mode in which power consumption is lower than the normal operation mode, and can selectively use these two modes according to the situation.

When the balancing time is set by the control unit 3 together with the balancing instruction, the cell con 41 performs an operation such as balancing during the set balancing time, and then stops. At this time, the start and stop circuit 411 stops the cell con 41 according to an instruction from the main timer 412 or an instruction from the stop management unit 413 when the main timer 412 is abnormal. By stopping the cell con 41 after the balancing is performed in this way, the power consumption of the battery cell 2 after the balancing is suppressed. However, at this time, the cell con 41 may not be completely stopped like the control unit 3 and may continue to operate in a standby state so that it can be started immediately upon receiving a signal from the control unit 3.

In the battery management device 1, since the control unit 3 and the cell cons 41 and 42 perform the operations described above, respectively, it is possible to perform balancing while the vehicle is stopped. Here, if it is attempted to perform balancing only while the vehicle is running, since it is not possible to secure a sufficient discharge time for equalizing the variation of each battery cell 2 within a limited time while the vehicle is running, balancing with a large current is required. However, in recent years, the capacity of the battery cell 2 has been increasing toward an increase of a mileage of the vehicle, and accordingly, a balancing current needs to be further increased. Since heat generation of the battery management device 1 increases as the balancing current increases, an appropriate heat dissipation structure or cooling structure is required. As a result, the convenience of the vehicle may be reduced due to an increase in size of the vehicle, or an electricity cost may be reduced due to an increase of a vehicle weight. On the other hand, according to the battery management device 1 of the present embodiment, since the balancing is possible even when the vehicle is stopped, it is possible to reduce the balancing current. Therefore, it is possible to solve the above-mentioned problems that occur during balancing while the vehicle is running. Note that in the present embodiment, the control unit 3 and the cell cons 41 and 42 are configured in the form illustrated in FIG. 1 so that the cell cons 41 and 42 can perform balancing both when the vehicle is running and when the vehicle is stopped. While the vehicle is running (key on), the control unit 3 may manage an execution time of balancing by transmitting a balancing ON command and a balancing OFF command to the cell cons 41 and 42.

In addition, the start and stop circuit 411 can stop the operation of the cell con 41 according to an instruction from the stop management unit 413 when the main timer 412 is abnormal. By doing so, even if the main timer 412 cannot operate normally due to a failure or the like, the cell con 41 can be stopped after the balancing is performed. Here, if the cell con 41 does not include the stop management unit 413, since the cell con 41 cannot be stopped when the main timer 412 fails, the power consumption of the battery cell 2 is continued even after the balancing is performed. In the battery management device 1 of the present embodiment, by disposing the stop management unit 413 in the cell con 41, it becomes possible to solve such a problem.

Figure 2:
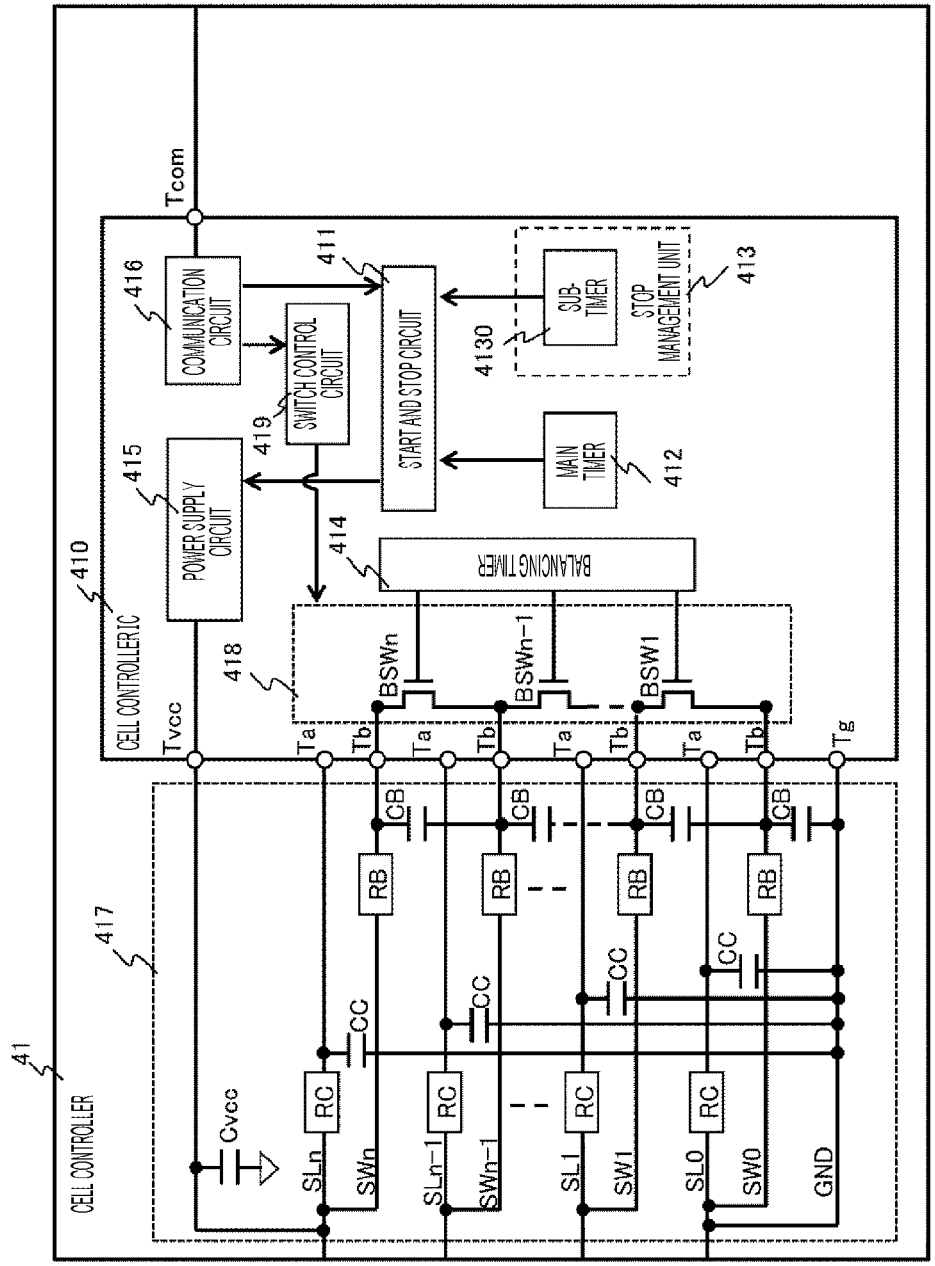
FIG. 2 is a diagram illustrating a configuration of a cell controller according to the first embodiment of the present invention.

Next, details of the cell con 41 including the stop management unit 413 will be described with reference to FIG. 2. FIG. 2 is a diagram illustrating a configuration of the cell con 41 according to the first embodiment of the present invention. Although the configuration of the cell con 41 is illustrated in FIG. 2, the cell con 42 has the same configuration as described above.

As illustrated in FIG. 2, the cell con 41 of the present embodiment includes a cell con IC 410 and a cell interface circuit 417. The cell con IC 410, which is a semiconductor integrated circuit, further includes a balancing timer 414, a power supply circuit 415, a communication circuit 416, a balancing switch 418, and a switch control circuit 419, in addition to the start and stop circuit 411, the main timer 412, and the stop management unit 413 described above. Note that in FIG. 2, each of these components was realized as a circuit inside the cell con IC 410, but may be realized as a circuit separate from the cell con IC 410. Alternatively, the cell con IC 410 may be configured using a plurality of semiconductor integrated circuits, and these components may be arranged in each semiconductor integrated circuit of the cell con IC 410 in an arbitrary distribution.

The communication circuit 416 is connected to the control unit 3 of FIG. 1 via a communication terminal Tcom, receives a communication signal transmitted from the control unit 3, and outputs the communication signal to the start and stop circuit 411 and the switch control circuit 419. The communication signal includes the above-mentioned balancing instruction or balancing time information transmitted from the control unit 3 when performing balancing. In addition, the communication circuit 416 acquires a voltage measurement result of each battery cell 2 measured by a voltage measurement circuit (not illustrated) and transmits the voltage measurement result to the control unit 3.

The power supply circuit 415 uses a voltage input from the battery cell 2 via a power supply terminal Tvcc to generate operating power of the cell con IC 410. The start and stop circuit 411 can stop the entire cell con 41 by stopping the operation of the power supply circuit 415 after performing the balancing.

The cell interface circuit 417 is a circuit that connects between each of the n battery cells 2 corresponding to the cell con 41 and the cell con IC 410, and includes n+1 sets of balancing paths and voltage measurement paths connected to the positive electrode and the negative electrode of each battery cell 2, respectively. That is, the cell interface circuit 417 includes n+1 balancing paths SW0 to SWn, which are paths for balancing each battery cell 2, and n+1 voltage measurement paths SL0 to SLn, which are paths for measuring the voltage of each battery cell 2. Note that, a ground line GND indicating a reference potential in the cell con 41 is connected in parallel to the balancing path SW0 and the voltage measurement path SL0 connected to the negative electrode of the battery cell 2 on the lowest potential side among the n battery cells 2. The ground line GND is connected to a ground terminal Tg of the cell con IC 410.

Resistors RC and capacitors CC, which form an RC filter for removing noise, are arranged on the voltage measurement paths SL0 to SLn, respectively.

The positive electrode and the negative electrode of each battery cell 2 are connected to a voltage measurement circuit (not illustrated) included in the cell con IC 410 via the voltage measurement paths SL0 to SLn and a voltage measurement terminal Ta of the cell con IC 410. The voltage measurement circuit is configured using, for example, an AD converter, and can acquire a voltage measurement result between the positive and negative electrodes of each battery cell 2 as a digital value. The voltage measurement result acquired by the voltage measurement circuit is reported to the control unit 3 via the communication circuit 416 as described above. The control unit 3 can manage a state of each battery cell 2 by using a voltage value of each battery cell 2 represented by the voltage measurement result.

Resistors RB and capacitors CB for adjusting the balancing current are arranged on the balancing paths SW0 to SWn, respectively. The positive electrode and the negative electrode of each battery cell 2 can be connected to each other via the balancing paths SW0 to SWn, a balancing terminal Tb and the balancing switch 418 of the cell con IC 410. At the time of performing balancing, a balancing current flows from the positive electrode to the negative electrode of each battery cell 2 through the balancing paths SW0 to SWn, so that each battery cell 2 is discharged.

The balancing switch 418 is configured with n switches BSW1 to BSWn corresponding to each battery cell 2. The switches BSW1 to BSWn are connected to the balancing paths SW0 to SWn of the cell interface circuit 417 via the balancing terminals Tb, respectively.

The switch control circuit 419 controls the balancing switch 418 according to the balancing instruction from the control unit 3 to discharge the battery cell 2 designated as a discharge target in the balancing instruction.

Specifically, the switch control circuit 419 perform controls to turn on a switch corresponding to the battery cell 2 designated as the discharge target by the control unit 3 among the switches BSW1 to BSWn in the balancing switch 418. As a result, a balancing current flows through the resistor RB, the battery cell 2 is discharged, and the balancing is performed. Note that at this time, the plurality of battery cells 2 may be discharged. In addition, the switch control circuit 419 may have a function of turning off all the balancing switches 418 in response to a balancing OFF command from the control unit 3 while the vehicle is running.

The balancing timer 414 measures an elapsed time from the start of balancing, controls the balancing switch 418 when the elapsed time reaches a discharge time included in the discharge instruction from the control unit 3, and ends the balancing. Specifically, when the elapsed time reaches the set discharge time, the switch control circuit 419 performs control to turn off the turned-on switch among the switches BSW1 to BSWn in the balancing switch 418. As a result, the discharging of the battery cells 2 that are being discharged is stopped, and the balancing ends. Note that in the balancing timer 414, instead of setting the discharge time according to the discharge instruction from the control unit 3, the discharge time may be set to a predetermined value set in advance. In addition, when the plurality of battery cells 2 are being discharged, the same discharging time may be set for all the battery cells 2 being discharged.

Alternatively, the balancing timer 414 may have n timers, which are the same as the number of battery cells 2, so that the discharge time can be set individually for each battery cell 2. By doing so, even while the control unit 3 is stopped, an individual discharge time can be set for each battery cell 2, and thus more precise balancing can be performed.

Here, the balancing current flowing at the time of balancing is generally larger than a current consumption of the cell con IC 410. Therefore, the priority of the current to be stopped when the cell con 41 fails is higher for the balancing current than for the current consumption of the cell con IC 410. In the battery management device 1 of the present embodiment, since the balancing timer 414 is arranged in the cell con 41, even if the main timer 412 and the stop management unit 413 fail at the same time, the balancing current can be stopped by the balancing timer 414 to reduce the power consumption of the battery cell 2. However, in this case, since the operation of the cell con IC 410 is continuing, the power of the battery cell 2 is consumed by the current consumption of the cell con IC 410 though the current consumption is smaller than the balancing current.

In the present embodiment, the stop management unit 413 includes a sub-timer 4130.

The sub-timer 4130 is a timer provided separately from the main timer 412, and measures the elapsed time after the cell con 41 starts the balancing like the main timer 412. Then, when the measured elapsed time reaches a predetermined stop time, the start and stop circuit 411 is instructed to stop the cell con 41. A stop time in the sub-timer 4130 is preferably longer than the balancing time, and may be a preset fixed value or a value dynamically set according to the balancing time. As a result, even when the main timer 412 cannot operate normally due to a failure or the like, the stop management unit 413 can stop the cell con 41 to end the balancing and suppress the power consumption of the battery cells 2.

According to the first embodiment of the present invention described above, the following operational effects are exhibited.

(1) The battery management device 1 includes the cell cons 41 and 42 that perform the balancing for adjusting the voltages of the plurality of battery cells 2 that are secondary batteries, and the control unit 3 that controls the cell cons 41 and 42. The cell con 41 includes the main timer 412 that measures the elapsed time for stopping the cell con 41, and the stop management unit 413 that stops the cell con 41 when the main timer 412 is abnormal. In the battery management device 1, the first power supply that supplies power to the main timer 412 and the stop management unit 413, that is, the battery cell 2, and the second power supply that supplies power to the control unit 3, that is, the lead storage battery 7 are power supplies different from each other. Since this is done, it is possible to improve reliability in balancing while suppressing power consumption during balancing.

(2) The control unit 3 has the normal operation mode in which power is supplied from the lead storage battery 7 to operate, and the low power consumption mode in which power consumption is lower than that in the normal operation mode.

The control unit 3 performs a balancing instruction for the cell cons 41 and 42 during the operation in the normal operation mode, and then shifts to the low power consumption mode. The cell cons 41 and 42 perform balancing when the control unit 3 is operating in the low power consumption mode. Since this is done, the power consumption of the lead storage battery 7 during balancing can be suppressed.

(3) The cell con 41 has the balancing timer 414 that ends the balancing when the elapsed time from the start of the balancing reaches a predetermined discharge time. Since this is done, even if the main timer 412 and the stop management unit 413 fail at the same time, it is possible to reduce the power consumption of the battery cell 2.

(4) The stop management unit 413 has the sub-timer 4130 that is provided separately from the main timer 412 and measures the elapsed time. When the elapsed time measured by the main timer 412 reaches the balancing time set by the control unit 3, or when the elapsed time measured by the sub-timer 4130 reaches a predetermined stop time longer than the balancing time, the cell con 41 stops. Since this is done, even if the main timer 412 is abnormal, the power consumption of the battery cell 2 can be suppressed by stopping the cell con 41 and ending the balancing.

Second Embodiment

Next, a second embodiment of the present invention will be described. In the present embodiment, an example will be described in which the stop management units 413 in the cell cons 41 and 42 are realized by means different from that described in the first embodiment. Note that a configuration of a battery management device according to the present embodiment is the same as that of the battery management device 1 of FIG. 1 described in the first embodiment, and thus a description thereof will be omitted. In addition, as in the first embodiment, since the cell cons 41 and 42 have the same configuration, only the cell con 41 will be described below, and the description of the cell con 42 will be omitted.

Figure 3:
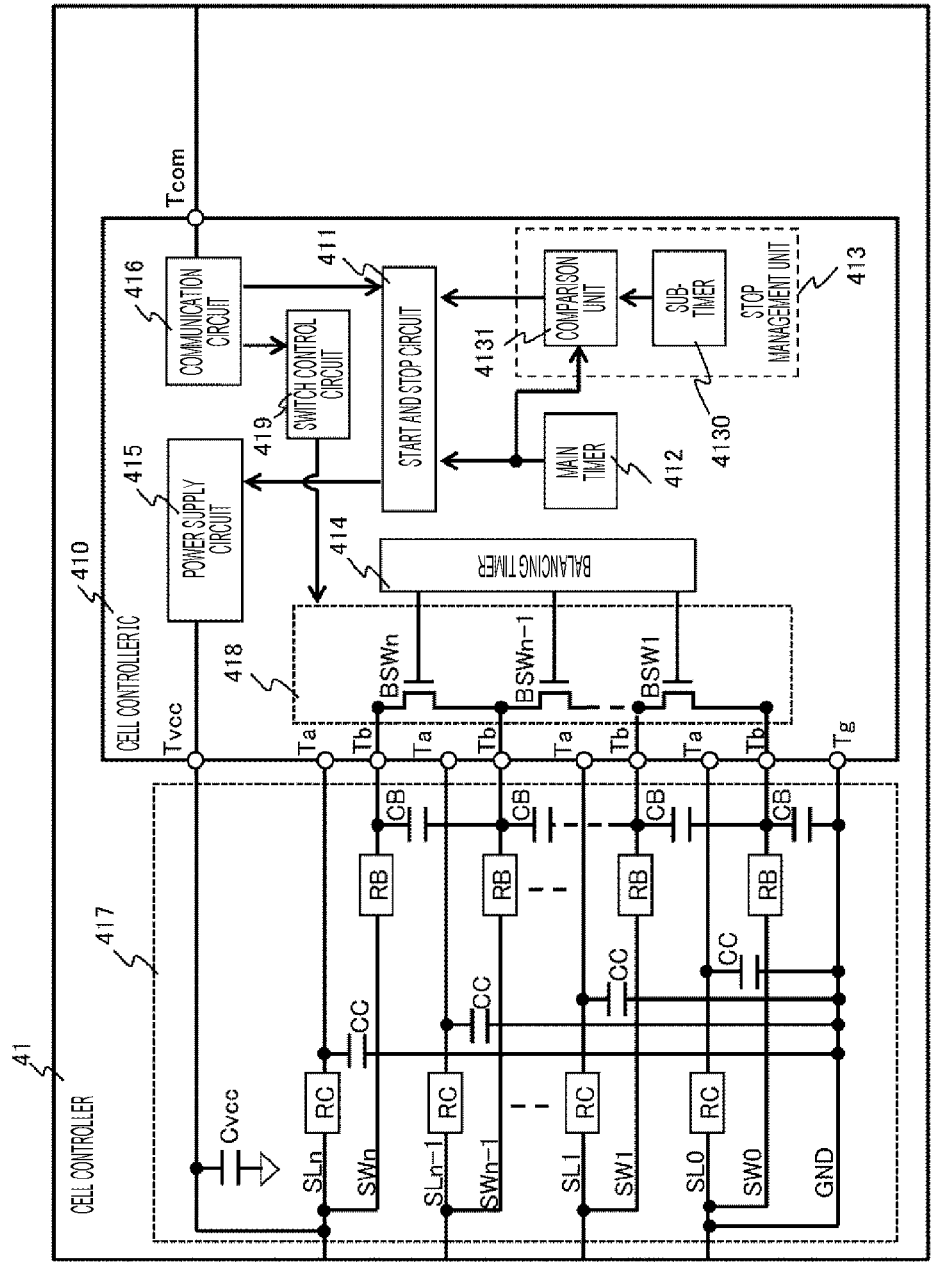
FIG. 3 is a diagram illustrating a configuration of a cell controller according to a second embodiment of the present invention.

FIG. 3 is a diagram illustrating a configuration of a cell con 41 according to a second embodiment of the present invention. As illustrated in FIG. 3, in the cell con 41 of the present embodiment, the stop management unit 413 includes a sub-timer 4130 and a comparison unit 4131. In addition, in other respects, the cell con 41 has the same configuration as that of the first embodiment illustrated in FIG. 2.

Similarly to the one described in the first embodiment, the sub-timer 4130 is a timer provided separately from the main timer 412, and measures the elapsed time after the cell con 41 starts balancing, that is, the elapsed time for stopping the cell con 41. The comparison unit 4131 compares the elapsed time measured by the main timer 412 with the elapsed time measured by the sub-timer 4130. As a result, when a difference between these comparison times is a predetermined value or more, it is determined that a time lag has occurred between the main timer 412 and the sub-timer 4130, and the start and stop circuit 411 is instructed to stop the cell con 41. As a result, similarly to the first embodiment, even when the main timer 412 cannot operate normally due to a failure or the like, the stop management unit 413 can stop the cell con 41 to end the balancing and suppress the power consumption of the battery cells 2. Further, in this case, the failure of the main timer 412 may be notified from the cell con 41 to the control unit 3.

By doing so, it becomes possible for the control unit 3 to grasp a location of the failure.

According to the second embodiment of the present invention described above, in addition to (1) to (3) described in the first embodiment, the following operational effects are further exhibited.

(5) The stop management unit 413 includes the sub-timer 4130 provided separately from the main timer 412 for measuring the elapsed time, and the comparison unit 4131 that compares the elapsed time measured by the main timer 412 with the elapsed time measured by the sub-timer 4130. When the elapsed time measured by the main timer 412 reaches the balancing time set by the control unit 3, or when the difference between the elapsed times compared by the comparison unit 4131 is a predetermined value or more, the cell con 41 stops. Since this is done, even if the main timer 412 is abnormal, the power consumption of the battery cell 2 can be suppressed by stopping the cell con 41 and ending the balancing.

Third Embodiment

Next, a third embodiment of the present invention will be described. In the present embodiment, an example in which the stop management units 413 in the cell cons 41 and 42 are realized by an analog circuit will be described. Note that a configuration of a battery management device according to the present embodiment is the same as that of the battery management device 1 of FIG. 1 described in the first embodiment, and thus a description thereof will be omitted. In addition, as in the first embodiment, since the cell cons 41 and 42 have the same configuration, only the cell con 41 will be described below, and the description of the cell con 42 will be omitted.

Figure 4:
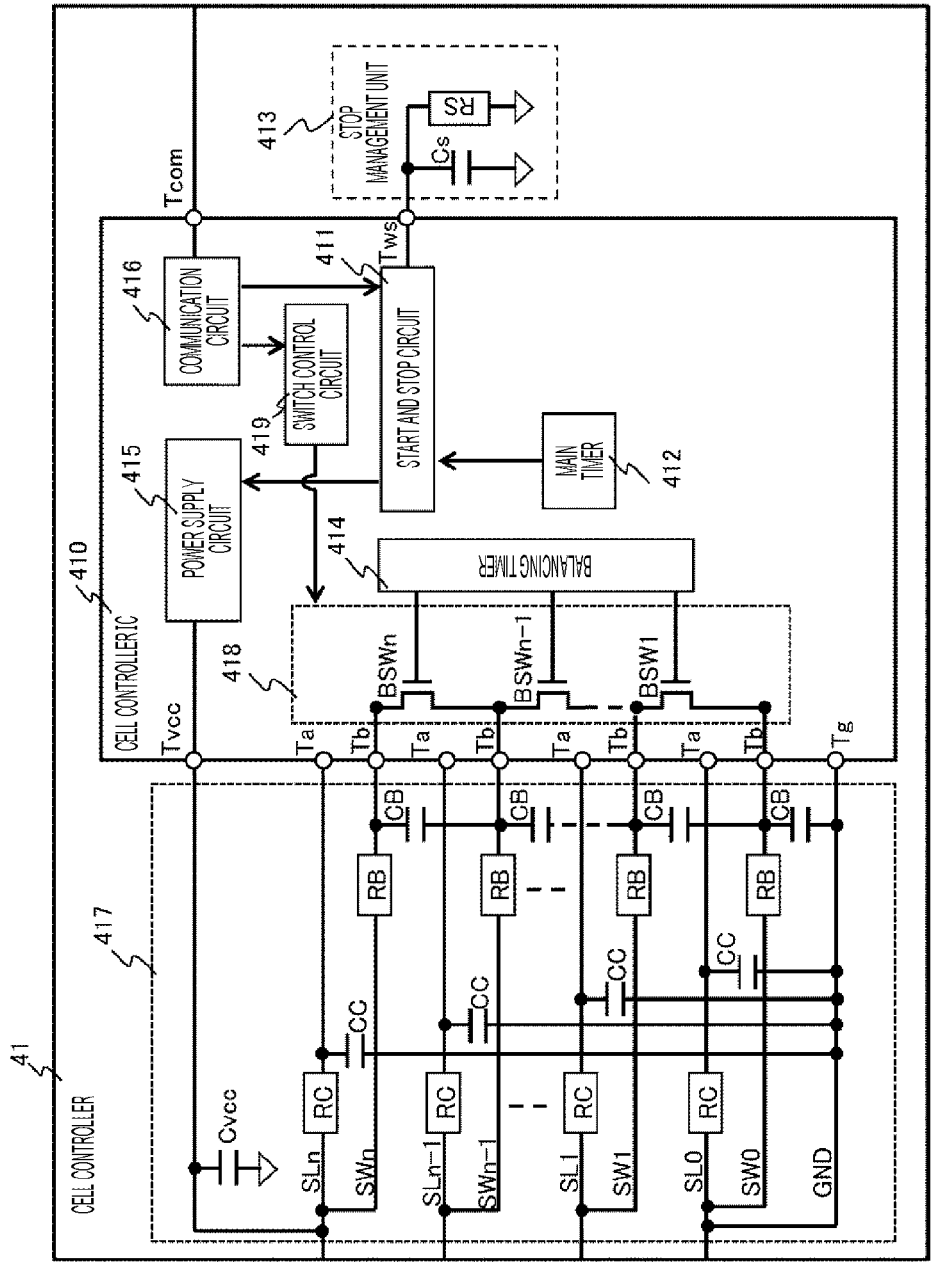
FIG. 4 is a diagram illustrating a configuration of a cell controller according to a third embodiment of the present invention.

FIG. 4 is a diagram illustrating a configuration of a cell con 41 according to a third embodiment of the present invention. As illustrated in FIG. 4, in the cell con 41 according to the present embodiment, the stop management unit 413 has an RC filter including a resistor RS and a capacitor Cs. In addition, in other respects, the cell con 41 has the same configuration as the first and second embodiments illustrated in FIGS. 2 and 3, respectively.

In the cell con 41 illustrated in FIG. 4, the stop management unit 413 configured by an RC filter is provided outside the cell con IC 410 and is connected to the start and stop circuit 411 in the cell con IC 410 via a signal input terminal Tws. The stop management unit 413 may be arranged inside the cell con IC 410. In the stop management unit 413, every time a communication signal from the control unit 3 is input to the cell con IC 410 via a communication terminal Tcom, the capacitor Cs in the RC filter is charged. When the control unit 3 stops and the communication signal is not input after the balancing instruction, a voltage signal whose voltage monotonically decreases at a rate according to a time constant of the RC filter is applied from the RC filter to the signal input terminal Tws by using the charge charged in the capacitor Cs. That is, in the stop management unit 413, the RC filter functions as a voltage signal output circuit that outputs a voltage signal whose voltage monotonously changes according to the elapsed time after the cell con 41 starts the balancing. Note that the voltage signal output from the stop management unit 413 may have a voltage that monotonously changes according to the elapsed time from the start of balancing. For example, the stop management unit 413 may output a voltage signal that monotonically increases according to the elapsed time.

The start and stop circuit 411 monitors the voltage signal input from the stop management unit 413 via the signal input terminal Tws, and maintains the operation of the cell con IC 410 when the voltage signal is a predetermined operating voltage V or more, while stops the cell con IC 410 when the voltage signal is less than the operating voltage V. The operating voltage V is determined according to the time constant of the RC filter included in the stop management unit 413 and the balancing time set for the main timer 412. Specifically, when the time during which the voltage signal of the stop management unit 413 is held at the operating voltage V or more after the start of balancing is a voltage holding time, the operating voltage V is determined so that the voltage holding time is longer than at least the balancing time. That is, the RC filter of the stop management unit 413 holds the voltage of the voltage signal output to the start and stop circuit 411 within the range of the operating voltage V or more during the voltage holding time longer than the balancing time set by the control unit 3. As a result, similarly to the first and second embodiments, even when the main timer 412 cannot operate normally due to a failure or the like, the stop management unit 413 can stop the cell con 41 to end the balancing and suppress the power consumption of the battery cells 2.

According to the third embodiment of the present invention described above, in addition to (1) to (3) described in the first embodiment, the following operational effects are further exhibited.

(6) The stop management unit 413 has the RC filter that functions as the voltage signal output circuit that outputs the voltage signal whose voltage monotonously changes according to the elapsed time. The RC filter holds the voltage of the voltage signal within a predetermined operating voltage range for a predetermined voltage holding time longer than the balancing time set by the control unit 3. When the elapsed time measured by the main timer 412 reaches the balancing time, or when the voltage of the voltage signal output from the RC filter falls outside the operating voltage range, the cell con 41 stops. Since this is done, even if the main timer 412 is abnormal, the power consumption of the battery cell 2 can be suppressed by stopping the cell con 41 and ending the balancing.

Fourth Embodiment

Next, a fourth embodiment of the present invention will be described. In the present embodiment, an example will be described in which the stop management units 413 in the cell cons 41 and 42 are realized in association with a specific failure mode of the main timer 412. Note that a configuration of a battery management device according to the present embodiment is the same as that of the battery management device 1 of FIG. 1 described in the first embodiment, and thus a description thereof will be omitted. In addition, as in the first embodiment, since the cell cons 41 and 42 have the same configuration, only the cell con 41 will be described below, and the description of the cell con 42 will be omitted.

The purpose of arranging the stop management unit 413 in the cell con 41 in the battery management device 1 is to suppress the power consumption of the battery cells 2 by stopping the cell con 41 after the balancing is performed even if the main timer 412 fails. Therefore, it is not necessary to be able to handle all the failure modes assumed in the main timer 412, and the stop management unit 413 that is capable of handling only the failure mode in which the cell con 41 cannot be stopped may be used. That is, the stop management unit 413 does not necessarily have to detect all failures of the main timer 412. In the present embodiment, an example of such a stop management unit 413 will be described.

Figure 5:
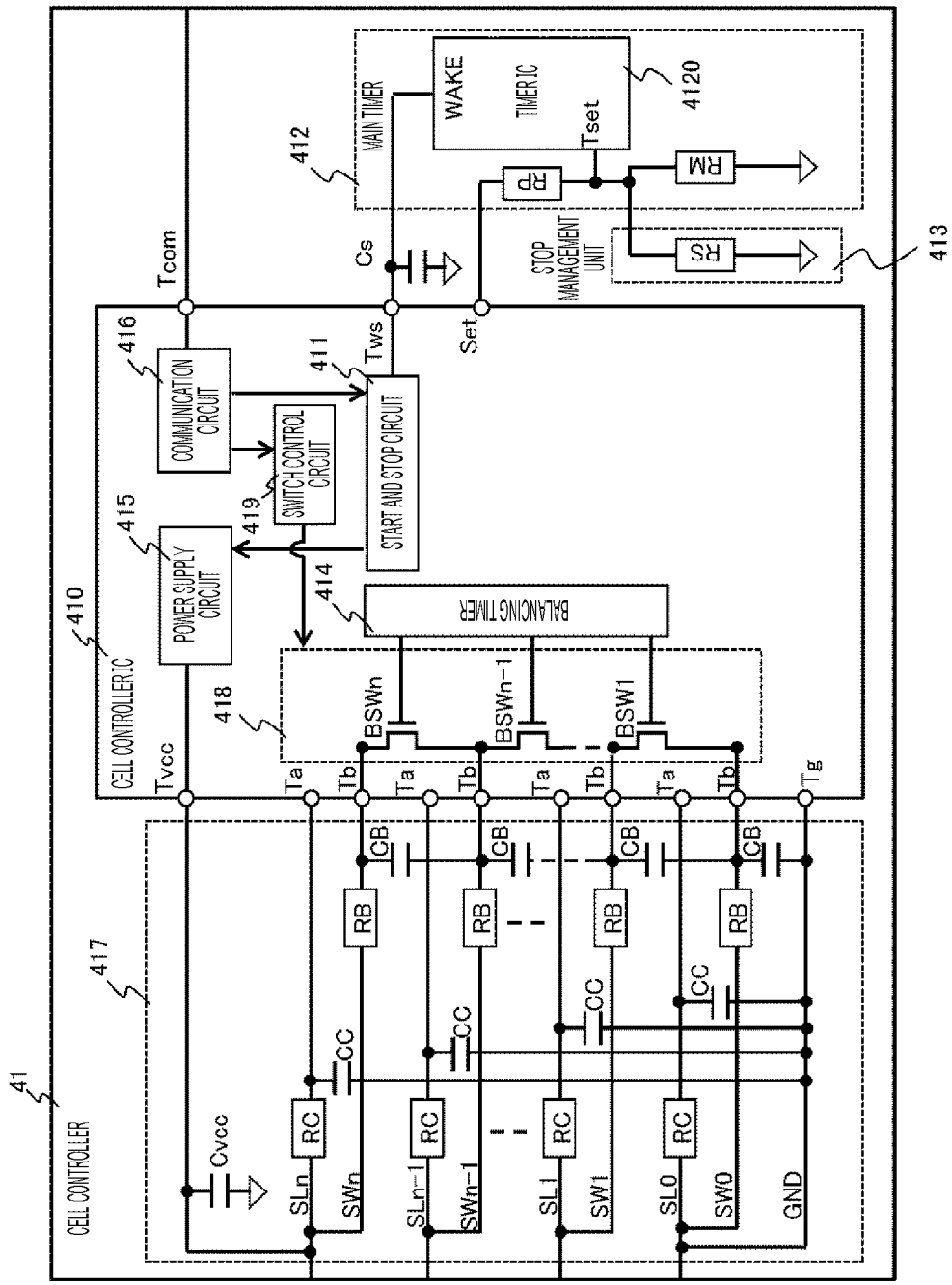
FIG. 5 is a diagram illustrating a configuration of a cell controller according to a fourth embodiment of the present invention.

FIG. 5 is a diagram illustrating a configuration of a cell con 41 according to a fourth embodiment of the present invention. As illustrated in FIG. 5, in the cell con 41 according to the present embodiment, the main timer 412 has a timer IC 4120 and a voltage dividing circuit configured with resistors RP and RM connected to a signal output terminal Set of the cell con IC 410. In addition, the stop management unit 413 has a resistor RS connected between the resistor RP and the resistor RM. Note that in other respects, the cell con 41 has the same configuration as that of the first to third embodiments illustrated in FIGS. 2 to 4, respectively.

In the cell con 41 illustrated in FIG. 5, the main timer 412 is provided outside the cell con IC 410. Note that the main timer 412 may be arranged inside the cell con IC 410. The timer IC 4120 of the main timer 412 is connected to the start and stop circuit 411 in the cell con IC 410 via the signal input terminal Tws. A capacitor Cs is connected between the signal input terminal Tws and the timer IC 4120, and the capacitor Cs is charged every time a communication signal from the control unit 3 is input to the cell con IC 410 via the communication terminal Tcom.

The timer IC 4120 has a start signal output terminal WAKE and a set signal input terminal Tset. The start signal output terminal WAKE is connected to the signal input terminal Tws of the cell con IC 410, and the set signal input terminal TSet is connected between the resistors RP and RM of the voltage dividing circuit.

When the balancing time is set by the control unit 3, the cell con IC 410 outputs a voltage from the signal output terminal Set to the voltage dividing circuit of the main timer 412 according to a set balancing time. The timer IC 4120 reads a voltage applied to the set signal input terminal Tset at a predetermined voltage division ratio from the voltage dividing circuit according to the voltage of the signal output terminal Set, and sets a start time of the cell con IC 410 based on the voltage. At this time, for example, the higher the voltage of the set signal input terminal Tset, the longer the start time is set. Then, during the set start time, the start signal output terminal WAKE outputs a start signal of a predetermined voltage or more to the signal input terminal Tws of the cell con IC 410. Note that as the voltage of the start signal output from the timer IC 4120, a voltage equal to or higher than the operating voltage V described in the third embodiment is set. When the set start time has elapsed, the timer IC 4120 stops outputting the start signal and sets the voltage applied to the signal input terminal Tws to less than the operating voltage V.

The start and stop circuit 411 monitors the start signal input from the timer IC 4120 via the signal input terminal Tws, and maintains the operation of the cell con IC 410 when the start signal is a predetermined operating voltage V or more, while stops the cell con IC 410 when the voltage signal is less than the operating voltage V. By such an operation of the start and stop circuit 411, the main timer 412 can stop the cell con 41 when the start time corresponding to the balancing time has elapsed.

Here, as a failure mode that is likely to occur in the main timer 412, a failure in which the resistor RP or the resistor RM of the voltage dividing circuit is in an open state can be considered. When the resistor RP is in the open state, the voltage applied to the signal input terminal Tset in the timer IC 4120 becomes 0 V regardless of the voltage of the signal output terminal Set. Therefore, in this case, since the start time set in the timer IC 4120 becomes shorter than usual, the power consumption of the battery cell 2 does not continue without stopping the cell con 41 after the end of balancing. However, on the other hand, when the resistor RM is in the open state, the voltage applied to the set signal input terminal Tset becomes higher than usual. Therefore, in this case, since the start time set in the timer IC 4120 becomes longer than usual, the power consumption of the battery cell 2 continues without stopping the cell con 41 after the end of balancing.

As described above, in the configuration of the main timer 412 as in the present embodiment, unless any measures are taken, a situation occurs that the power consumption of the battery cell 2 cannot be suppressed depending on the failure mode of the main timer 412. However, in the present embodiment, since the stop management unit 413 is configured by using the resistor RS connected between the resistor RP and the resistor RM, it is possible to prevent the above situation from occurring. Specifically, even when the resistor RM is in the open state, the set signal input terminal Tset of the timer IC 4120 is grounded via the resistor RS of the stop management unit 413. Therefore, the voltage applied to the set signal input terminal Tset does not become so large as compared with a normal time, and it is possible to set the start time that is allowable in the system and stop the cell con 41. That is, the stop management unit 413 can shorten the start time when the start time becomes abnormally long in the main timer 412. As a result, similarly to the first to third embodiments, even when the main timer 412 cannot operate normally due to a failure or the like, the stop management unit 413 can stop the cell con 41 to end the balancing and suppress the power consumption of the battery cells 2.

According to the fourth embodiment of the present invention described above, in addition to (1) to (3) described in the first embodiment, the following operational effects are further exhibited.

(7) The main timer 412 sets the start time for the cell con 41 according to the balancing time set by the control unit 3. The cell con 41 stops when the elapsed time from the start of balancing reaches the start time. The stop management unit 413 shortens the start time when the start time becomes abnormally long in the main timer 412. Since this is done, even if the main timer 412 is abnormal, the power consumption of the battery cell 2 can be suppressed by stopping the cell con 41 and ending the balancing.

Fifth Embodiment

Next, a fifth embodiment of the present invention will be described. In the present embodiment, an example will be described in which a timer for switching the operation mode of the control unit 3 is further provided.

Figure 6:
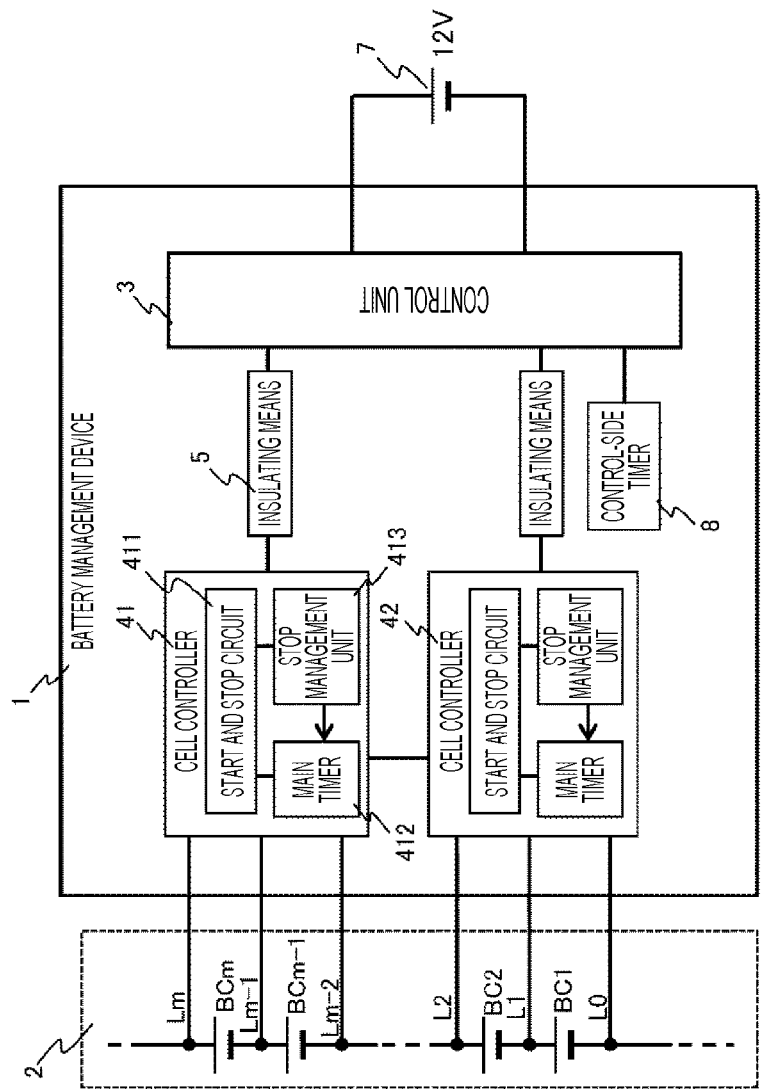
FIG. 6 is a diagram illustrating a configuration of a battery management device according to a fifth embodiment of the present invention.

FIG. 6 is a diagram illustrating a configuration of a battery management device according to a fifth embodiment of the present invention. The battery management device 1 illustrated in FIG. 6 further includes a control-side timer 8 in addition to the components of the first embodiment described in FIG. 1. The control-side timer 8 measures a time after the control unit 3 stops an operation thereof when performing balancing, and starts the control unit 3 when the measured time reaches the balancing time to restart the operation thereof. The configurations other than the control-side timer 8 are the same as those in FIG. 1, and the description thereof will be omitted. In addition, the cell cons 41 and 42 can have any of the configurations of FIGS. 2 to 5 described in the first to fourth embodiments, respectively.

In the present embodiment, the control unit 3 sets a balancing time for the main timer 412 when performing balancing, and also sets the balancing time for the control-side timer 8, and then enters a stop or standby state and shifts to the low power consumption mode. Note that at this time, the control unit 3 may further set the discharge time or the stop time to the balancing timer 414 or the sub-timer 4130 in the stop management unit 413. The control-side timer 8 measures a time after the control unit 3 shifts to the low power consumption mode, and restarts the control unit 3 when the time reaches the set balancing time to shift to the normal mode. Then, the control unit 3 sets the balancing time for the main timer 412 and the control-side timer 8 and then enters the stop or standby state again. Even in this case, the discharge time or the stop time may be set to the balancing timer 414 or the sub-timer 4130 in the stop management unit 413. In the battery management device 1 of the present embodiment, such an operation is repeated while the vehicle is stopped. Note that if the time is longer than the balancing time, a time different from the balancing time may be set for the control-side timer 8.

According to the battery management device 1 of the present embodiment, by performing the above-mentioned operation using the control-side timer 8, the balancing can be performed in several steps while the vehicle is stopped. Generally, since the voltage of the battery cell 2 immediately after the vehicle is stopped is unstable, there is a problem that error becomes large if the balancing control is performed using the voltage immediately before or after the vehicle is stopped. However, in the battery management device 1 of the present embodiment, the balancing control can be performed using a stable voltage of the battery cell 2 when a certain amount of time has passed after the vehicle is stopped. Therefore, it is possible to perform precise balancing.

In addition, when individually setting the balancing time for each battery cell 2 to perform the balancing, it is generally necessary that the balancing timer 414 has the same number of timers as the number of battery cells 2 as described above. However, in the battery management device 1 of the present embodiment, it is not necessary for the balancing timer 414 to have a plurality of timers by dividing and balancing as described above. That is, the balancing time is set for one battery cell 2 during one balancing time, and by repeating such a setting for the number of battery cells 2, it is possible to discharge all the battery cells 2 in individual balancing times. As a result, the balancing timer 414 can be realized with only one timer, and the circuit of the cell con 41 can be simplified. In particular, when a large number of battery cells 2 are monitored by the battery management device 1, an effect of miniaturization and cost reduction by simplifying the circuit is increased.

Note that the control-side timer 8 may be used to further monitor the main timer 412. In this case, by setting a time longer than the balancing time set in the main timer 412 for the control-side timer 8 and checking whether or not the main timer 412 is stopped when the control unit 3 is restarted, it is possible to diagnose the main timer 412. However, in the case in which the vehicle is transported, since the power supply from the lead storage battery 7 is cut off, the main timer 412 cannot be diagnosed using the control-side timer 8. Therefore, in this case, a function of stopping the cell con 41 by the stop management unit 413 is required so that the cell con 41 can be stopped and the power consumption of the battery cell 2 can be suppressed even if the main timer 412 fails.

According to the fifth embodiment of the present invention described above, in addition to (1) to (7) described in the first to fourth embodiments, the following operational effects are further exhibited.

(8) The battery management device 1 includes the control-side timer 8 that measures the time after the control unit 3 shifts to the low power consumption mode. The control unit 3 shifts from the low power consumption mode to the normal operation mode based on the time measured by the control-side timer 8. Since this is done, it is possible to perform precise balancing while reducing a circuit scale.

Note that the embodiments and various modifications described above are merely examples, and the present invention is not limited to these contents as long as the characteristics of the invention are impaired. In addition, although various embodiments or modifications have been described above, the present invention is not limited to these contents. Other modes considered within the scope of the technical idea of the present invention are also included in the scope of the present invention.

REFERENCE SIGNS LIST 1 battery management device
2 battery cell
3 control unit
5 insulating means
7 lead storage battery
8 control-side timer
41 cell controller (cell con)
42 cell controller (cell con)
410 cell con IC
411 start and stop circuit
412 main timer
413 stop management unit
414 balancing timer
415 power supply circuit
416 communication circuit
417 cell interface circuit
418 balancing switch
419 switch control circuit

The invention claimed is:

1. A battery management device comprising
a cell controller that performs balancing for adjusting voltages of a plurality of secondary batteries; and
a control unit that controls the cell controller,
wherein the cell controller includes a main timer for measuring an elapsed time for stopping the cell controller, and a stop management unit that stops the cell controller when the main timer is abnormal,
wherein a first power supply that supplies power to the main timer and the stop management unit, and a second power supply that supplies power to the control unit, are different from each other,
wherein the stop management unit includes a sub-timer that is provided separately from the main timer and measures the elapsed time, and
wherein the cell controller stops when the elapsed time measured by the main timer reaches a balancing time set by the control unit, or when the elapsed time measured by the sub-timer reaches a predetermined stop time longer than the balancing time.

2. The battery management device according to claim 1, wherein the control unit includes a normal operation mode in which power is supplied from the second power supply to operate, and a low power consumption mode in which power consumption is lower than the normal operation mode,
the control unit performs a balancing instruction for the cell controller during operation in the normal operation mode, and then shifts to the low power consumption mode, and
the cell controller performs the balancing when the control unit is operating in the low power consumption mode.

3. The battery management device according to claim 2, further comprising a control-side timer that measures a time after the control unit shifts to the low power consumption mode,
    wherein the control unit shifts from the low power consumption mode to the normal operation mode based on the time measured by the control-side timer.

4. The battery management device according to claim 1, wherein the stop management unit includes a comparison unit that compares the elapsed time measured by the main timer with the elapsed time measured by the sub-timer, and
    the cell controller stops when a difference between the elapsed times compared by the comparison unit is a predetermined value or more.

5. The battery management device according to claim 1, wherein the stop management unit includes a voltage signal output circuit that outputs a voltage signal whose voltage monotonously changes according to the elapsed time,
    the voltage signal output circuit holds a voltage of the voltage signal within a predetermined operating voltage range for a predetermined voltage holding time longer than a balancing time set by the control unit, and
    the cell controller stops when the elapsed time measured by the main timer reaches the balancing time, or when the voltage of the voltage signal falls outside the operating voltage range.

6. The battery management device according to claim 1, wherein the cell controller includes a balancing timer that ends the balancing when the elapsed time reaches a predetermined discharge time.

7. An integrated circuit mounted on a cell controller that is connected to a plurality of secondary batteries and performs balancing for adjusting voltages of the plurality of secondary batteries, the integrated circuit comprising:
    a main timer that measures an elapsed time for stopping the cell controller; and
    a stop management unit that stops the cell controller when the main timer is abnormal,
    wherein the main timer and the stop management unit operate by receiving power supplied from a power supply different from a control unit that controls the cell controller,
    wherein the stop management unit includes a sub-timer that is provided separately from the main timer and measures the elapsed time, and
    the cell controller stops when the elapsed time measured by the main timer reaches a balancing time set by the control unit, or when the elapsed time measured by the sub-timer reaches a predetermined stop time longer than the balancing time.

8. A battery management device comprising
a cell controller that performs balancing for adjusting voltages of a plurality of secondary batteries; and
a control unit that controls the cell controller,
    wherein the cell controller includes a main timer for measuring an elapsed time for stopping the cell controller, and a stop management unit that stops the cell controller when the main timer is abnormal,
    wherein a first power supply that supplies power to the main timer and the stop management unit, and a second power supply that supplies power to the control unit, are different from each other,
    wherein the main timer sets a start time for the cell controller according to a balancing time set by the control unit,
    wherein the cell controller stops when the elapsed time reaches the start time,
    wherein the elapsed time begins when the balancing commences and ends at the start time, and
    wherein the stop management unit shortens the elapsed time when the elapsed time becomes abnormally long in the main timer.

9. The battery management device according to claim 8, wherein the control unit includes a normal operation mode in which power is supplied from the second power supply to operate, and a low power consumption mode in which power consumption is lower than the normal operation mode,
    the control unit performs a balancing instruction for the cell controller during operation in the normal operation mode, and then shifts to the low power consumption mode, and
    the cell controller performs the balancing when the control unit is operating in the low power consumption mode.

10. The battery management device according to claim 9, further comprising a control-side timer that measures a time after the control unit shifts to the low power consumption mode,
    wherein the control unit shifts from the low power consumption mode to the normal operation mode based on the time measured by the control-side timer.

11. The battery management device according to claim 8, wherein the stop management unit includes a sub-timer that is provided separately from the main timer and measures the elapsed time, and a comparison unit that compares the elapsed time measured by the main timer with the elapsed time measured by the sub-timer, and
    the cell controller stops when the elapsed time measured by the main timer reaches a balancing time set by the control unit, or when a difference between the elapsed times compared by the comparison unit is a predetermined value or more.

12. The battery management device according to claim 8, wherein the stop management unit includes a voltage signal output circuit that outputs a voltage signal whose voltage monotonously changes according to the elapsed time,
    the voltage signal output circuit holds a voltage of the voltage signal within a predetermined operating voltage range for a predetermined voltage holding time longer than a balancing time set by the control unit, and
    the cell controller stops when the elapsed time measured by the main timer reaches the balancing time, or when the voltage of the voltage signal falls outside the operating voltage range.

13. The battery management device according to claim 8, wherein the cell controller includes a balancing timer that ends the balancing when the elapsed time reaches a predetermined discharge time.

* * * * *